(12) United States Patent
Notte et al.

(10) Patent No.: US 12,270,774 B2
(45) Date of Patent: Apr. 8, 2025

(54) SYSTEM TO INSPECT, MODIFY OR ANALYZE A REGION OF INTEREST OF A SAMPLE BY CHARGED PARTICLES, SET OF SYSTEMS TO INSPECT, MODIFY OR ANALYZE A REGION OF INTEREST OF A SAMPLE AND METHOD TO INSPECT, MODIFY OR ANALYZE A REGION OF INTEREST OF A SAMPLE BY CHARGED PARTICLES

(71) Applicant: Carl Zeiss SMT GmbH, Oberkochen (DE)

(72) Inventors: John A. Notte, Gloucester, MA (US); Mark D. DiManna, Fremont, NH (US); Jeffrey Sauer, Danvers, MA (US); Terry Griffin, Salem, MA (US)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 18/653,555

(22) Filed: May 2, 2024

(65) Prior Publication Data

US 2024/0288391 A1     Aug. 29, 2024

Related U.S. Application Data

(62) Division of application No. 17/344,338, filed on Jun. 10, 2021, now Pat. No. 12,044,638.

(Continued)

(51) Int. Cl.
*G01N 23/2251* (2018.01)
*G01N 23/2202* (2018.01)

(52) U.S. Cl.
CPC ..... *G01N 23/2251* (2013.01); *G01N 23/2202* (2013.01); *G01N 2223/309* (2013.01); *G01N 2223/3301* (2013.01)

(58) Field of Classification Search
CPC .. H01J 37/05; H01J 37/20; H01J 37/28; H01J 37/3056; H01J 2237/202;
(Continued)

(56) References Cited

U.S. PATENT DOCUMENTS 8,969,835 B2    3/2015 Zeile et al.
2008/0224374 A1    9/2008 Hasuda
(Continued)

FOREIGN PATENT DOCUMENTS

KR    20060032137 A    4/2006

OTHER PUBLICATIONS

Kokubo et al, "Digital image processing: A path to better pictures", 1982, Ultramicroscopy, Elsevier, Amsterdam, vol. 8, No. 3, pp. 277-286 (Year: 1982).*

*Primary Examiner* — David E Smith
*Assistant Examiner* — Hsien C Tsai
(74) *Attorney, Agent, or Firm* — Fish & Richardson P.C.

(57) ABSTRACT

A system inspects, modifies or analyzes a region of interest of a sample via charged particles. A detector device of the system produces a pixel image having horizontal and vertical pixel resolutions. A charged particle deflection device produces a scanning charged particle beam in a scanning region. The deflection device has horizontal and vertical deflection units controlled by a digital to analog converter having a digital resolution larger than the horizontal pixel resolution and/or the vertical pixel resolution. An operator control interface of the system selects an assignment between respective image pixels of a desired pixel image and digital inputs of the DAC to produce horizontal and/or vertical deflection signals to guide the charged particle beam to the location of the respective image pixel. A reliable (Continued)

image of a sample can be obtained even when there is zooming or panning within an accessible region of the sample.

20 Claims, 5 Drawing Sheets

Related U.S. Application Data

(60) Provisional application No. 63/150,722, filed on Feb. 18, 2021.

(58) Field of Classification Search
CPC ..... H01J 2237/20292; H01J 2237/2817; H01J 2237/2446; H01J 2237/2441; G01N 23/2251; G01N 23/2202; G01N 23/225; G01N 2223/309; G01N 2223/3301
See application file for complete search history.

(56) References Cited

U.S. PATENT DOCUMENTS

2017/0323763 A1* 11/2017 Itai ..................... H01J 37/147
2022/0260508 A1 8/2022 Notte et al.

* cited by examiner

SYSTEM TO INSPECT, MODIFY OR ANALYZE A REGION OF INTEREST OF A SAMPLE BY CHARGED PARTICLES, SET OF SYSTEMS TO INSPECT, MODIFY OR ANALYZE A REGION OF INTEREST OF A SAMPLE AND METHOD TO INSPECT, MODIFY OR ANALYZE A REGION OF INTEREST OF A SAMPLE BY CHARGED PARTICLES

CROSS-REFERENCE TO RELATED APPLICATIONS

This application is a divisional of U.S. application Ser. No. 17/344,338, filed Jun. 10, 2021, which claims priority under 35 U.S.C. § 119(e)(1) to U.S. Provisional Application No. 63/150,722, filed Feb. 18, 2021. The entire disclosure of each of these applications is incorporated by reference herein.

FIELD

The disclosure relates to a system to inspect, modify or analyze a region of interest of a sample by charged particles. The disclosure also relates to a set of systems to inspect, modify or analyze a region of interest of a sample by different inspection, modification or analyzing schemes, including inspection, modification or analysis by charged particles. The disclosure further relates to a method to inspect, modify or analyze a region of interest of sample by charged particles using such a system.

BACKGROUND

An inspection system to inspect a region of interest of a sample by charged particles is known from U.S. Pat. No. 8,969,835 B2.

SUMMARY

The disclosure seeks to provide a system with reliable imaging, modification/patterning or analysis of a sample even in case zooming or shifting of an image or pattern of the sample is desired, for example even when zooming or panning within an accessible region of the sample is desired.

In a general aspect, the disclosure provides a system to inspect, modify or analyze a region of interest of a sample by charged particles. The system includes a detector device to produce a pixel image having a horizontal pixel resolution and a vertical pixel resolution, and a charged particle deflection device to produce a scanning charged particle beam in a scanning region in which the region of interest. The deflection device includes a horizontal deflection unit to produce a horizontal deflection of the charged particle beam, and a vertical deflection unit to produce a vertical deflection of the charged particle beam. The horizontal deflection unit and/or the vertical deflection unit is/are controlled by a digital to analog converter (DAC) having a digital resolution larger than the horizontal pixel resolution and/or the vertical pixel resolution. The system also includes an operator control interface in signal connection with the detector device and the deflection voltage generating units to select an assignment between: respective image pixels of a desired pixel image; and digital inputs of the digital to analog converters to produce horizontal and/or vertical deflection signals necessary to guide the charged particle beam to the location of the respective image pixel.

In a general aspect, the disclosure provides a system to inspect, modify or analyze a region of interest of a sample by charged particles. The system includes a charged particle column including a charged particle generating device and a charged particle deflection device to produce a scanning charged particle beam in a scanning region in which the region of interest. The system also includes a sample chamber having a sample stage. The system further includes an alignment subsystem to prealign the sample on a sample holder to be later mounted on the sample stage in the sample chamber. The alignment subsystem includes an external kinematic mount to temporally receive the sample holder. The external kinematic mount has a lateral positioning repeatability relative to the sample holder which is better than 200 um. The external kinematic mount is located external to the sample chamber. The alignment subsystem also includes an external imaging device to acquire a relative lateral position of the sample on the sample holder when mounted to the external kinematic mount. The alignment subsystem further includes a fine adjustment device to finely adjust the relative lateral position of the sample on the sample holder when mounted to the external kinematic mount. In addition, the alignment subsystem includes a locking unit to lock the sample on the sample holder at a chosen relative lateral position after fine adjustment. The system further includes an internal kinematic mount to receive the sample holder on the sample stage. The internal kinematic mount has a lateral positioning repeatability relative to the sample holder which is at least the positing repeatability of the external kinematic mount. The internal kinematic mount is located within the sample chamber. In addition, the system includes a transfer unit to transfer the sample locked to the sample holder from the external kinematic mount to the internal kinematic mount.

The system may provide charged particles in form of at least one charged particle beam. Focused charged particle beam instruments (FIBs and SEMs) can be used for imaging, modifying, or analyzing a region of interest on a sample. For simplicity, we describe the imaging application, but the descriptions herein can be generalized for the other inspection applications including but not limited to modifying/patterning, or analysis.

Typically, the sample itself may be relatively large, say 1 cm, 2 cm, or 5 cm across. The region of interest may be smaller, say 1 um (1 um=1 μm), 10 um or 100 um, and may be located almost anywhere on or under the surface of the sample. The focused beam may be quite small-on the order of 10 nm, 1 nm, or smaller. Often, there is a single feature of interest on the entirety of the sample.

A challenge for the instrument operator is to transfer their sample into the microscope, and then find the desired region of interest using the ion or electron beam. This can take appreciable time and effort. In certain known systems, an in-vacuum stage can play an important role as the sample is moved under the charged particle beam until the operator finds the region of interest.

Once the instrument operator has finally located the region of interest, they often will then pan and zoom progressively to achieve the fields of view suitable for their activities. For example, it may be desirable for them to find an easily recognized a fiducial or fiducials on the surface with a 500 um FOV. It may also be desirable for them to then pan the beam (shifting the beam), or invoke stage motions (shifting the sample) for a known distance relative to these fiducials to find a target location or to survey a broader region. Subsequently, it may be desirable for them to zoom further in to perform an imaging, analysis, or modification of a smaller region or regions of interest.

As an example, some of the routine steps used in circuit edit or inspection are described in further detail. This is exemplary only, and should not limit the scope of the applications served by the present disclosure. In a focused ion beam instrument, the operator will typically find three pre-established fiducials on the sample and use these to establish a coordinate lock. This may be done with the charged particle beams or with an auxiliary optical microscope or infrared microscope which is integrated into the same chamber. Then, for example, by referencing the design information of the sample (aka CAD or blueprint information), they may find an arbitrary feature through the affine coordinate transformation or more sophisticated coordinate mappings. The circuit edit application would then typically call for driving a target location under the ion beam so that ion beam milling to expose the sub-surface target region. This may involve the local delivery of etch assisting gases such as XeF2, to enhance the material removal rate or to provide preferential removal of one material over another. When the desired circuit is exposed, the instrument operator may achieve many processes on the circuit of interest. They may interrupt a conductive circuit by ion beam sputtering. They may use endpointing to indicate the depths of penetration as different layers offer different SE (secondary electron) signal generation. They may deposit new materials, both insulators and conductors through the use of precursor gases and beam assisted deposition processes. They may perform imaging to monitor and assess their progress or analysis to yield compositional information. For circuit applications, all of these activities might be within a 70, 50, 30, 20, or 10 micron rectangular region (1 micron=1 um=1 μm).

In a SEM or FIB, once a broad region of interest on the sample has been positioned with the stage under the electron or ion beam, the operator may want to change magnification and pan. Changing magnification is also known as zooming in or out, or changing the field of view (FOV). Panning the image, or shifting the image, moves the center of the imaging area to a nearby part of the sample.

Relatively early FIBs and SEMs used analog signal (signal ramps) to deflect the beams, and produce the raster pattern for imaging applications. More recently, with the advent of digital imaging, the horizontal and vertical DACs used to produce the horizontal and vertical deflection signals to offer 10 bit resolution used for a 1024 pixel image. (1024=2^10). In both cases, higher magnification images can involve special lower gain amplifies to diminish the H and V signals to produce smaller deflections of the beam to achieve the higher magnification. And, similarly, lower magnification images can involve special higher gain amplifiers to produced larger deflections of the beam to achieve to lower magnification. The change in magnification can call for the horizontal and vertical (H&V) beam deflection signals to pass through a set of amplifiers which provide desirable signal gain or attenuation to achieve the deflection of the electron or ion beam and hence the desired magnification.

In certain known systems, different fields of view involve different amplifiers. For example, a 5 um FOV might call for the signals to be diminished or attenuated to achieve the correct beam placement accuracy. Whereas a different set of amplifiers might be used to increase the signals to achieve a 10 um FOV, or 20 um FOV, . . . or even the much larger 500 um FOV. Different amplifiers are engaged through signal switching. And each amplifier might be optimized for different fields of view such as every factor of 2× increase in the magnification or every decade (10×) change in magnification. Each amplifier has its own imperfections and switching between them introduces errors such as gain errors and offset errors for both H and V signals, that are to be corrected for. So as the magnification is progressively increased, the operator, in certain known systems, often observes sudden and discontinuous shifts in the image corresponding to these amplifiers being switched. These errors cause the smallest features to be at unpredicted locations which is often perilous for some FIB and SEM tasks-such as circuit edit. These errors can be corrected for, but they may change over time or temperature as components change.

Panning the image can call for the introduction of static (DC) offsets to these H and V signals before they reach these amplifiers. Note that the H and V signals usually originate from digital to analog (DAC) convertors which can produce close approximations of analog signals but in reality are discrete output voltages corresponding to digital programming of the DAC. For systems that use magnetic deflection to deflect the beam, the DAC ultimately controls a proportional current rather than a voltage, but otherwise the concept is fundamentally the same.

Using at least one digital to analog converter according to the disclosure having a larger number of accessible values than the number of pixels of the pixel image can enable a selectable assignment between the respective image pixels of the desired pixel image and the digital inputs of the digital analog converter with higher resolution produce the deflection signal values, e.g. deflection voltage output values. The number of values accessible by the DAC herein after also is referred to as digital or DAC resolution. The number of pixels in the image herein after also is referred to as pixel resolution. Via the selectable assignment, a digital switch between different magnifications of the pixel image and/or a shifting of the pixel image within the region of interest is possible. No amplifier change is necessary to produce different deflection signals avoiding undesired amplifier changing effects. Discontinuities in gain and offset of such amplifier changes can be avoided. The assignment between the DAC values, and the pixels in the image may can include an approximation step to choose between different possible digital inputs of the digital analog converter which are close to a desired deflection signal value. Such an approximation assignment may include a randomization. Such an assignment may be such that it includes image correction demands, for example, digitally correct imaging errors produced by an image distortion device of the system. Pixels for such image distortion errors and image drift, rotation barrel distortion, field distortions, or more sophisticated beam placement errors.

The image detector device may be an image control device.

The horizontal deflection unit may be a horizontal deflection voltage generating unit. Such horizontal deflection voltage generating unit may produce a horizontal deflection voltage for horizontal scanning movement of the charged particle beam.

The vertical deflection unit may be a vertical deflection voltage generating unit. Such vertical deflection voltage generating unit may produce a vertical deflection voltage for vertical scanning movement of the charged particle beam.

The digital to analog converter may be part of the horizontal deflection unit and/or the vertical deflection unit.

The horizontal deflection signal and/or the vertical deflection signal may be a horizontal/vertical deflection voltage output value.

The operator control interface may be embodied as an image selecting device.

While all of the descriptions here refer to generating images, the same techniques may be put into play when patterning a sample or performing analysis on a sample. The beam placement can be controlled with much higher fidelity relative to the reference image if there is no change in the amplifier gain stages. This can allow higher fidelity patterning or analysis.

In some embodiments of an inspection system, the pixel resolution of the pixel image and the DAC resolution of the digital to analog converter can be described by a power of 2 and the DAC resolution is at least 2 times larger than the pixel resolution. This can enable a high fidelity imaging. The DAC resolution may be $2^2, 2^3, 2^4, 2^5, 2^6, 2^7, 2^8, 2^9$ or $2^{10}$ times larger than the number of pixels in the image. Even larger differences are possible. The number of pixels in the image may be 10 bit ($2^{10}$). The digital resolution may be 20 bit ($2^{20}$). Describing the resolution ratio by a power of 2 is not mandatory. The DAC resolution is desirably only be larger than the corresponding size. Preferably, such DAC resolution is appreciably larger, e.g. at least larger by a factor of 2.

In some embodiments of an inspection system, the operator control interface includes an image zoom capability to alter an image magnification of the region of interest via a respective assignment between the respective image pixels of a chosen zoom image and the digital inputs of the digital to analog converter. This can provide a selectable magnification of the pixel image without interchanging between different amplifiers to produce different output voltage regions. The image zoom capability may be embodied as an image zoom unit.

In some embodiments of an inspection system, the operator control interface includes an image shifting capability to alter an image position within the region of interest via a respective assignment between the respective image pixels of a chosen shift image and the digital inputs of the digital to analog converter. This can enable a selection of a position of the pixel image within the region of interest without amplifier switching. The image shifting capability may be embodied as an image shifting unit.

The DAC increment being fixed to an integer number of LSB's (least significant bits) will inherently limit the available options for FOV when zooming in. However, it is possible to choose almost arbitrary FOVs if the desired increment is allowed to be a non-integer. The assignment programming of the image selecting device then chooses the closest adjacent digital value for the DAC to generate the best possible H and V signal. Alternatively, the when the desired DAC increment is between two available integers it can be randomly assigned to one of the nearby two integers to avoid possible aliasing effects.

The available DAC space may be a regularly sub-sampled array (grid) with fixed increments in the horizontal and vertical DAC codes. These may generate nominal images. If there are known to be imperfections in the scanning hardware or the optics, these may be corrected by signal processing. For example, signal processing of the H and V signals may be done by multiplication representing sine and cosine functions and combining the results to correct for scan rotations and orthogonality. This may correct for basic set of scan distortions. These scan distortions and more sophisticated scan distortions (barrel distortions, pincushion distortion, parallelogram distortion, quadrilateral distortions, etc.) may also be corrected digitally by adjusting the DAC codes relative to their nominal values. This may involve a calculation of the transformation from the desired pixel location on the sample to the DAC space.

The disclosure also seeks to provide a reliable sample positioning, i.e. a reliable positioning of a region of interest overlapping with a sample inspection region, for example, a reliable positioning of the sample's region of interest under a limited region that can be exposed by a charged particle beam.

In certain known systems, the mechanical stage plays a role in moving the selected region of the sample under the ion beam. For most applications the stage's primary activity is to provide X and Y motion of the sample, although rotation and tilt and Z motion are also common to establish the proper perspective and imaging conditions. Through this X and Y motions, a desired point on the sample (fiducials, reference site, feature so interest) can be positioned under the ion or electron beam. The sample to be imaged/analyzed/modified is attached to a provided sample holder which can be transported in a predictable way from outside the process chamber to inside the process chamber. The sample holder may have a proprietary fixturing system such as a dovetail mount. Affixing the sample to this sample holder is usually a matter of little consequence since the in-vacuum stage can be controlled to adjust the X, Y position to locate almost any region of the sample under the chosen beam. In certain known systems, the stage is an integral component in the design of most SEMs and FIBs, and represents one of the most technically challenging, expensive, and least reliable components of these instruments. Such stage also greatly increases other risks such as vibration (vulnerability to environmental acoustics, floor vibrations, etc.), drift (where the sample on the stage moves relative to the beam), and contamination artifacts (due to transfer of volatile or surface mobile lubricants of the mechanical stage).

According to this aspect of the disclosure, there is no mechanical stage in the sample chamber to locate an arbitrary region of interest under the chosen charged particle beam. This saves costs, improves reliability, and enhances performance by reducing vibrations, drift, and contaminants. In this disclosure, the sample is positioned on the sample holder with the alignment subsystem with high precision so that after transfer into the sample chamber, the targeted feature of interest will be directly under the ion or electron beam. Apart from standard hardware of such instruments this design involves four basic components:

(1) There are kinematic mounts with high X,Y positioning repeatability, both in the internal (in sample chamber), and external (on the lab bench), to which the sample holder can be mounted. Designs of such kinematic mounts may assure repeatable positioning at the few micron scale or better. The sample holder may be mounted first to the external kinematic mount, and the sample can be precisely and rigidly affixed there. Thereafter an airlock may be used to transfer the sample on the sample holder to the internal kinematic mount within the sample chamber.

(2) There are mechanisms for visualizing the sample while on the external kinematic mount, i.e. the external imaging device, so that the sample's location perceived with high resolution can be adjusted to put the targeted region of interest at the point which will subsequently be under the electron or ion beam. This may be an optical microscope with high magnification. Ideally such an optical microscope would offer configurable crosshairs to indicate the ideal location for the feature of interest. The microscope may be fully digitized. An initial calibration and configuration of the optical microscope and cross hairs relative to the external kinematic mount may assure a one-to-one correspondence between the location of the ion or electron beam, and the cross hairs or center of the optical microscope.

(3) There are mechanisms for making fine adjustments to the sample on the sample holder before it is locked in place, i.e. the fine adjustment device. This could be in the form of X, Y micrometer dials or a motorized precision X,Y stage, or any other fine positioning mechanism. These may be adjusted until the visible feature of interest is positioned under the optical microscope cross hairs.

(4) There are mechanisms for locking down the sample when it is properly positioned, i.e. the locking unit. This may be achieved with reliance on friction, or glue, wax, silver paint, carbon tape, electrostatics, or a magnetic circuit that enhances normal force and friction. The locking mechanism is designed to be sufficient so that the sample holder can be transported from the external kinematic mount to the internal kinematic mount without introducing any lateral shift greater than acceptable (e.g. less than 2 um, less than 10 um, less than 50 um).

The alignment subsystem provides a reliable alignment of the sample relative to the sample holder to facilitate the placement of a region of interest within a sample inspection region.

With this alignment subsystem, a reproducible positioning of the sample on the sample holder is possible. This may be useful in case multiple regions of a sample are to be examined. In that case it is possible to unload the sample and reposition it on the sample holder externally.

The disclosure does not preclude tilted samples, or rotated samples or height adjusted samples. These special orientations or positions can be attained by the attachment of the sample to the sample holder, or by kinematic mounts that are preconfigured for these orientations or positions.

A lateral positioning repeatability may be better than 150 um, better than 100 um, better than 80 um, better than 10 um, better than 5 um, better than 3 um, better than 2 um, better than 1 um. As a rule, the lateral positioning repeatability may have a lower limit in the range of 50 um. In certain embodiments, such lateral positioning repeatability may be better than 50 um.

A kinematic mount having such a lateral positioning repeatability is commercially available.

The charged particle column may be embodied as a charged particle inspection subsystem.

An inspection system may include the features mentioned, i.e. may include both the features described above.

In some embodiments, the charged particle column is a FIB or an SEM. Such charged particles subsystems have been proven to be useful for sample inspection.

In some embodiments, the external imaging device is an optical microscope, an infrared microscope, or a fluorescence microscope. Such external imaging devices have proven to be useful to acquire the relative lateral position of the sample on the sample holder.

The external imaging device could alternatively be an infrared microscope (IR Microscope) which is known to be especially useful in the circuit edit application where the transparency of the silicon at certain wavelengths can be exploited to find the desired fiducials or features of interest. The external imaging device could alternatively be a fluorescence microscope which is of special interest in many life science applications where markers to readily be recognized by their fluorescing under certain wavelengths of illumination.

In some embodiments, the sample stage enables less than 500 um of relative movement between the sample holder and a frame of the system. Such a sample stage may offer a very limited range of motion (say 1 mm in X and Y) with a technology that is cheaper, more reliable less vulnerable to vibrations drift, contamination as compared to certain known mechanical stages which were designed to adjust a sample position to locate almost any region under the chosen beam. Such provision of a sample stage enabling limited relative movement allows less precise external pre-registration. The limited relative movement between the sample holder and the frame of the system may be less than 2 mm. As an example a piezo mechanical flexure stage can provide the limited range of travel which is suitable for such sample stage. In particular, the sample stage does not need to offer any more motion than the repeatability of the kinematic mount.

Alternatively, the sample stage may be rigidly fixed to the frame without enablement of a relative movement between the sample holder and the frame of the inspection system.

In some embodiments, the disclosure provides a set of systems to inspect, modify or analyze a region of interest of a sample by different schemes including inspection, modification or analysis by charged particles. One of these systems is a system described above. All the individual systems include: a charged particle column to inspect, modify or analyze a sample in a region in which the region of interest can be placed; a sample chamber having a sample stage, wherein the systems of the set share a common alignment subsystem to prealign the sample on a sample holder to be later mounted on the sample stage in the sample chamber. The alignment subsystem includes: an external kinematic mount to temporally receive the sample holder, the external kinematic mount having a lateral positioning repeatability relative to the sample holder which is better than 200 um, the external kinematic mount being located external to the sample chamber; an external imaging device to acquire a relative lateral position of the sample on the sample holder when mounted to the external kinematic mount; a fine adjustment device to finely adjust the relative lateral position of the sample on the sample holder when mounted to the external kinematic mount; and a locking unit to lock the sample on the sample holder at a chosen relative lateral position after fine adjustment. All of the individual systems of the set include an internal kinematic mount to receive the sample holder on the sample stage. The internal kinematic mount has a lateral positioning repeatability relative to the sample holder which is at least the positing repeatability of the external kinematic mount. The internal kinematic mount is located within the sample chamber. A family of instruments, such as optical microscopes, SEMs, FIBs, can all rely upon the same kinematic mounts for reliable and repeatable sample transfer between them. This allows for the same region of interest to be imaged, analyzed, modified in all of these instruments (all with no or limited internal stages) provided the same kinematic mounting scheme is adopted through-out, and the initial sample positioning on the holder is performed. The systems of the set may share a transfer unit to transfer locked to the sample holder from the external kinematic mount to the internal kinematic mount.

The disclosure also seeks to provide a method to enable reproducible positioning of a feature of interest of the sample when it is withdrawn from the system and subsequently reinserted into the same system.

In a general aspect, the disclosure provides a method to repeatedly inspect, modify or analyze a region of interest of a sample by charged particles using a system described herein. The method includes the following steps: attaching a sample to a sample holder; mounting the sample holder to an external kinematic mount; acquiring a relative position of the sample on the sample holder using an external imaging device; fine adjusting the relative position of the sample on the sample holder using a fine adjustment device, the adjustment being such that a given relative position results enabling inspection, modifying or analyzing of the region of interest in a subsequent inspection, modification or analyzing step; locking the sample on the sample holder after fine adjustment; transferring the sample holder with the finely adjusted sample from the external kinematic mount to an internal kinematic mount inside a sample chamber of the system; inspecting modifying or analyzing the region of interest of the sample with the system; unloading sample on the sample holder from internal kinematic mount from the system, and allowing a time to pass; and reloading the sample into the same system and finding the region of interest within 500 um of the scanned region.

The advantages of such a method are those which are discussed with respect to the system and the set of systems above.

During the method, the sample on the sample holder can be unloaded from the internal kinematic mount from the system after which a certain period of time is allowed to pass. For example, during the method, the sample may be removed for such certain period of time. Such period of time may be a short period of time, e.g. 10 min or less, or may be a long period of time, e.g. 1 day or longer.

During the method, after removal/unloading of the sample for a certain period, the sample can be later replaced/reloaded in the same system with high precision relative to an original placement during the initial performance of the inspecting, modifying or analysing method.

The sample may be processed externally, or the system can be made available for other samples. The sample may be reloaded into the same system with a repeatability of positioning better than 1 mm, better than 500 um, better than 100 um, better than 10 um or better than 5 um. As a rule, such repeatability has a lower limit in the region of 1 um.

BRIEF DESCRIPTION OF THE DRAWINGS

Illustrative embodiments of the disclosure herein after are described with respect to the accompanying figures, in which.

DESCRIPTION OF ILLUSTRATIVE EMBODIMENTS

Figure 1:
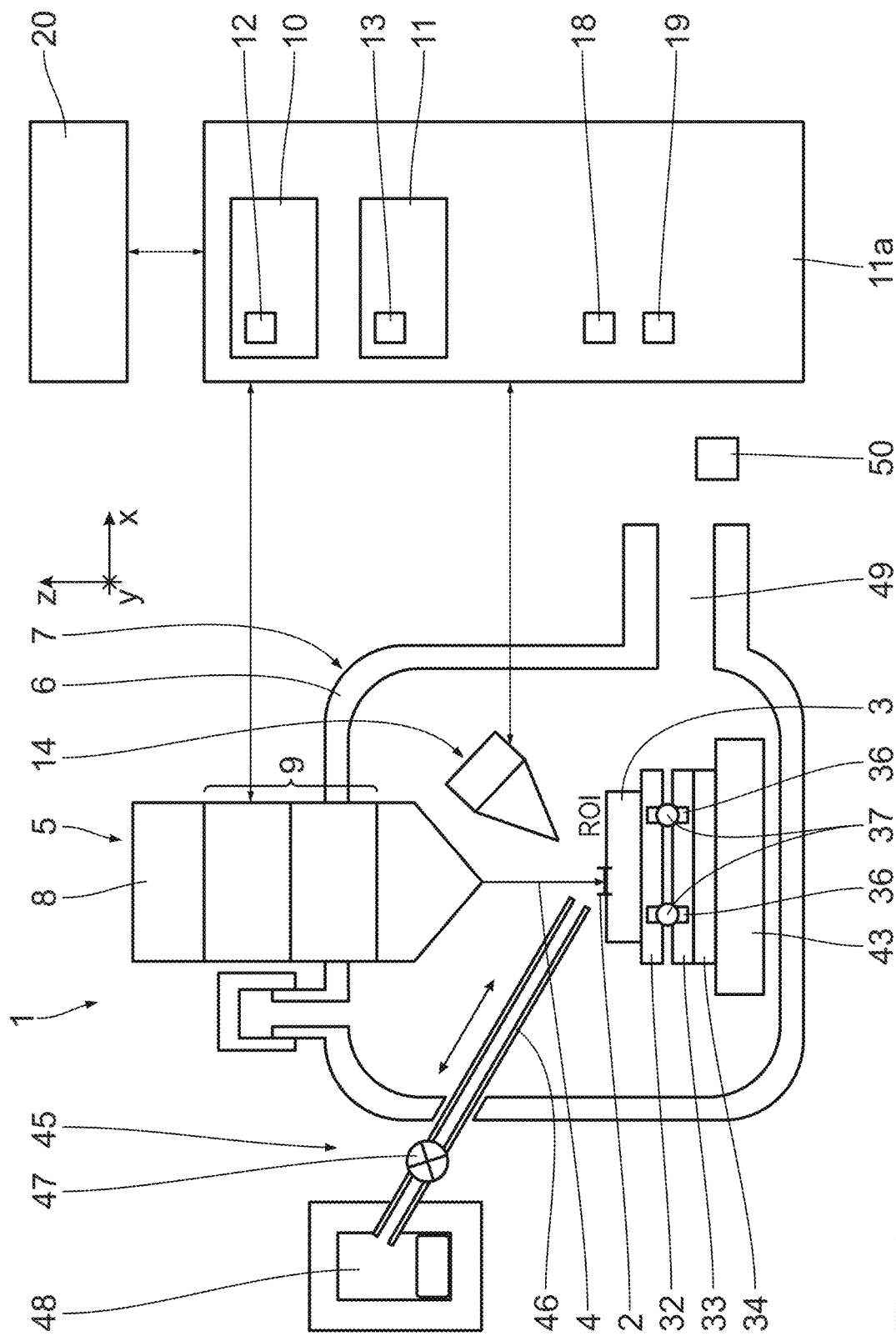
FIG. 1 shows in a schematical sectional view an embodiment of an inspection system to inspect a region of interest of a sample by charged particles.

An inspection system 1 serves to inspect a region of interest (ROI) 2 of a sample 3 by charged particles 4, e.g. ions and/or electrons. The system includes a charged particle device 5, e.g. a scanning electron microscope (SEM) or a focused ion beam (FIB) device. The charged particle device 5 is designed as a column and is mounted on a frame 6 of a sample processing chamber 7. The charged particle device 5 has a charged particle generating unit 8 followed by a charged particle deflection device 9 to produce a scanning beam of the charged particles 4 in a scanning region in which the ROI 2 can be placed.

To facilitate the description of orientations and dimensions, in the following a Cartesian xyz coordinate system is used. In FIG. 1 the x axis is directed to the right. The y axis is directed perpendicular to the drawing plane away from the view and the z axis is directed upwards.

The deflection device 9 is connected to a horizontal deflection voltage generating unit 10 and a vertical deflection voltage generating unit 11. The horizontal deflection voltage generating unit 10 produces a horizontal deflection voltage for horizontal scanning movement, i.e. movement in +/−x-direction of the charged particle beam. The vertical deflection voltage generating unit 11 produces a vertical deflection voltage for vertical scanning movement, i.e. movement in the +/−y-direction of the charged particle beam.

The deflection voltage generating units 10, 11 are part of a control electronics 11*a* which is in signal connection with further components of the system 1 as described below. Such signal connection is visualized in FIG. 1 with double arrows.

The horizontal deflection voltage generating unit 10 includes a digital to analog converter (DAC) 12. The vertical deflection voltage generating unit 11 includes a digital to analog converter (DAC) 13. The DACs 12, 13 are contained within the adjacent control electronics 11*a* and are part of the deflection voltage generating units 10 and 11. The horizontal deflection is provided by the horizontal deflection voltage generating unit 10 within the control electronics 11*a* including the DAC 12. The vertical deflection is provided by the vertical deflection voltage generating unit 11 within the control electronics 11a including the DAC 13.

Further, the inspection system 1 has an imaging detector 14 to produce a pixel image of the ROI 2 having a horizontal pixel resolution and vertical pixel resolution. Such imaging detector 14 herein after also is referred to as a detector device or as an image control device. The image detector 14 is in signal connection with the control electronics 11a. On the right hand side of FIG. 6 an example of such pixel image 15 is shown with an exemplified sample structure image 16 having the shape of the letter "F". The pixel image 15 has a total of 1024×1024 image pixels. The pixel image 15 has a horizontal pixel resolution and a vertical pixel resolution of 1024×1024. Such pixel image resolution thus is 10 bit.

In a further embodiment, the horizontal pixel resolution of the pixel image 15 may be different to its vertical pixel resolution.

The DACs 12, 13 of the deflection voltage generating units 10, 11 have a digital resolution which is larger than the corresponding horizontal and vertical pixel resolution.

Figure 6:
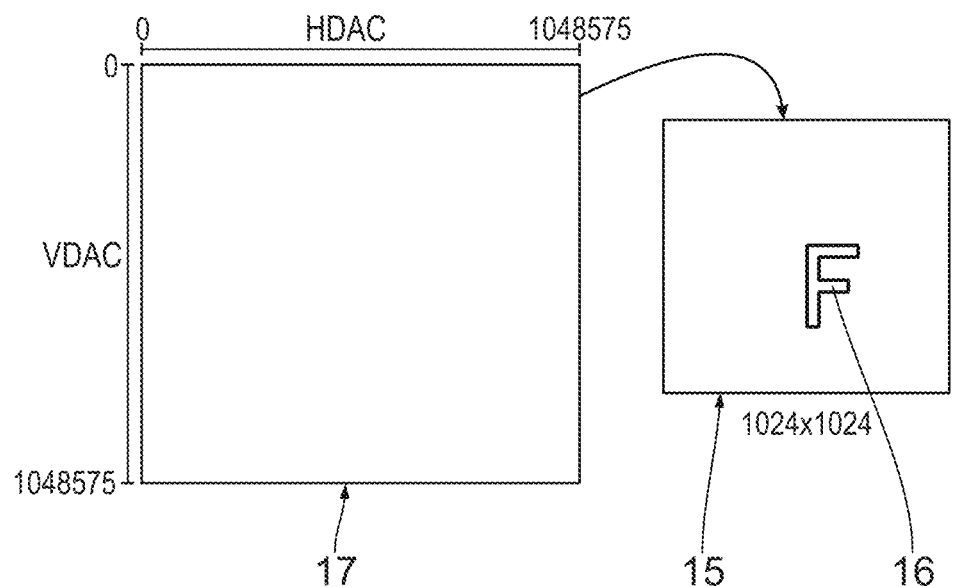
FIG. 6 in a depiction similar to that of FIG. 5 an assignment between the bit space and the pixel image according to the disclosure, wherein the adjacent pixel in the pixel image correspond to an increment of 1024 bits in the DAC code.

The digital resolutions of the DACs 12, 13 may be 20 bit as is exemplified in a bit space 17 also shown in FIG. 6. Such bit space includes in both directions x, y 2$^{20}$=1048575 bits.

The digital resolution of the DACs 12, 13 may be at least two times larger than the pixel resolution.

The pixel resolution of the pixel image 15 and/or the digital resolution of the DACs 12, 13 may be described by a power of 2. Some SEM or FIB instruments might achieve a beam deflection with currents in coils rather than with voltage on electrodes. In such case, the signals from the DACs 12, 13 are simply converted to currents.

The deflection voltage output of the DACs 12, 13 may be in a range between −10 V and +10 V.

A setting time of a setting of a chosen voltage output value of the DACs 12, 13 may be 1 μs at most.

The control electronics 11a includes an image zoom capability 18 and an image shifting capability 19 which are exemplified as respective units 18, 19. The image zoom capability 18 serves to alter an image magnification of the ROI 2. The image shifting capability 19 serves to alter an image position within the ROI 2.

The inspection system 1 further includes an operator control interface 20 being in signal connection with the control electronics 11a which is further connected to the image detector device 14. The operator control interface 20 herein after also is referred to as an image selecting device. The capabilities or units 18, 19 may be part of the image selecting device 20 or (as shown) of the control electronics 11a.

The image selecting device 20 allows the operator or automated software algorithms to select an assignment between respective image pixels of the chosen pixel image 15 and digital inputs of the DACs 12, 13 to produce horizontal and vertical deflection voltage output values used to guide the charged particle beam to the location of the respective image pixel. In particular, the imaging selecting device 20 or operator control interface allows the operator to select an assignment between individual x and y pixels of the desired image 15 and the horizontal and vertical DAC output values within the bit space 17. Such assignment is simplified through a graphical user interface that allows the user to specify intuitive variables like image resolution, image field of view (FOV), and x and/or y image shift, and possibly rotations or distortions of the image. Once such assignment is established, the image acquisition proceeds with the DACs 12, 13 generating the output values to guide the charged particle beam to the location of the respective image pixel.

To produce the voltage outputs via the DACs, no amplifier interchange is necessary within the whole bit space 17 provided by the DACs 12, 13.

The respectively selected assignment via the operator control interface may include an approximation step to choose between different possible digital inputs which are close to the desired deflection voltage output value. For example, such approximation step helps to decide whether a bit $x_i$, $x_{i+1}$ and/or $y_i$, $y_{i+1}$ of the bit space 17 is the appropriate one to approximate the desire x/y voltage output value.

Such approximation provided by the operator control interface may include a randomization process. Further, such assignment may include a provision of image correction demands.

The working principle of the image selecting device 20 further is described by reference to FIGS. 5 to 9.

Figure 5:
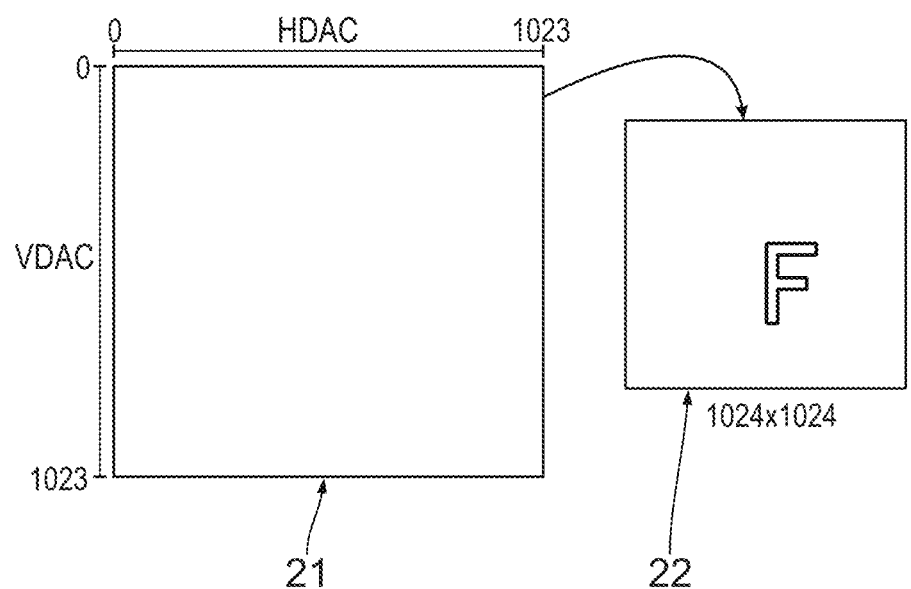
FIG. 5 one example of an assignment between (1) a two dimensional bit space spanned up by the digital to analog converters (DACs) of a horizontal deflection voltage generating unit and of a vertical deflection voltage generating unit of a charged particle deflection device of the inspection system and (2) a corresponding pixel image of the sample, wherein each adjacent pixel in the pixel image corresponds to an increment of 1 bit in the DAC code of the bit space, wherein this assignment is an example of certain known technology.

FIG. 5 shows a certain known assignment between a bit space 21 of DACs and a pixel image 22 in a system of the certain known technology. Here, each adjacent pixel in the pixel image 22 corresponds to an increment of 1 bit in a code of the respective DAC. Both the bit space 21 and the pixel image 22 have a 1024×1024 resolution.

FIGS. 6 to 9 show different pixel image selection results provided by the operator control interface 20 of the inspection system 1 according to the disclosure.

In FIG. 6 each adjacent pixel in the image 15 (image pixel increment=1) corresponds to an increment of 1024 bit in the DAC code of the bit space 17.

An integral and differential linearity of the DACs 12, 13 may be better than 1 least significant bit (LSB). In the FIG. 6 embodiment the full bit space 17 is programmed via the operator control interface 20 to produce output voltages with DAC code increments of 1024 bits. The 1024 resulting bit use of e.g. the horizontal DAC 12 would be 0, 1023, 2047, . . . 1048575. By an alternative assignment, also a pixel image with a pixel resolution more than 1024×1024 is possible, i.e. 2048×2048, 4096×4096, . . . until even 1048576×1048576.

Figure 7:
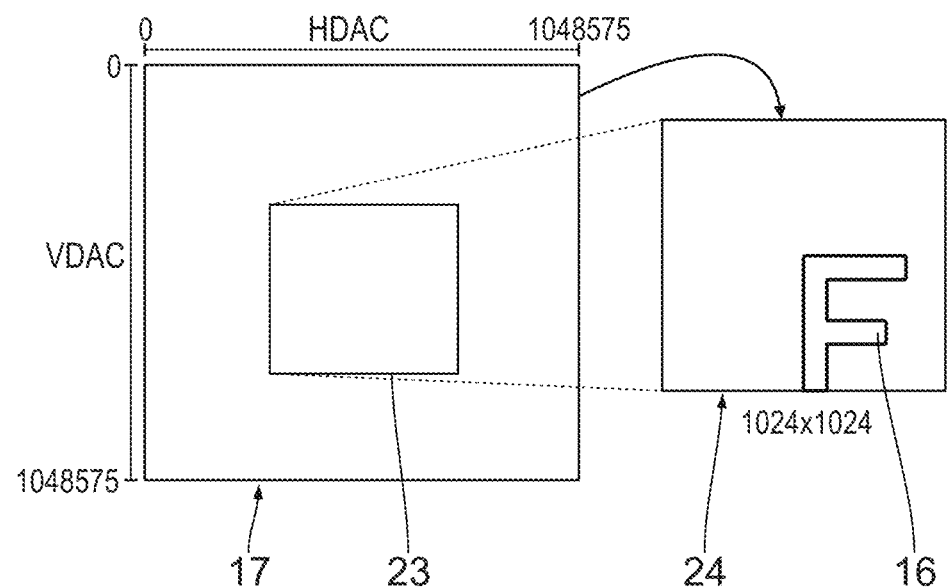
FIG. 7 in a depiction similar to that of FIG. 5 an assignment between the bit space and the pixel image according to the disclosure, wherein each adjacent pixel in the pixel image corresponds to an increment of 512 bits in the DAC code.

FIG. 7 shows the situation where a central ¼ area 23 of the available bit space 17 is used to generate output voltages assigned to respective pixels of a magnified pixel image 24. An increment of each DAC value of the bit space 17 within such central area 23 would then be 512. Accordingly, the resulting pixel image 24 has a magnification of 2× as compared to the pixel image 15 of FIG. 6. No change of an amplifier is necessary to achieve this magnification change.

Figure 8:
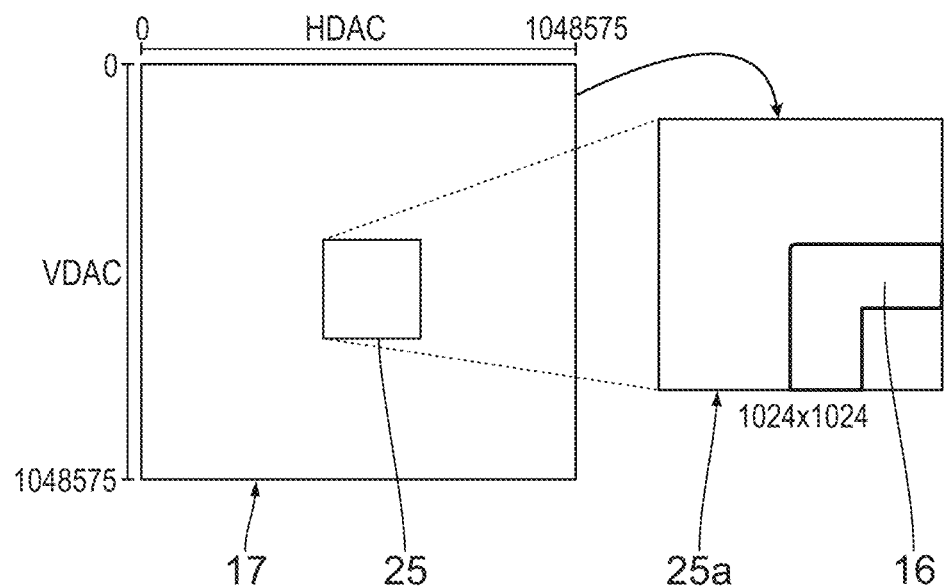
FIG. 8 in a depiction similar to that of FIG. 5 an assignment between the bit space and the pixel image according to the disclosure, wherein the adjacent pixel in the pixel image corresponds to an increment of 100 bits in the DAC code.

FIG. 8 shows a further magnification example, where a further limited central area 25 of the bit space 17 corresponding to a DAC bit increment of 100 to produce a pixel image 25a again with pixel resolution of 1024×1024. Such DAC bit increment of 100 corresponds to a magnification of approximately 10×. Accordingly, a small section of the overall structure 16 is now shown in the pixel image 25a.

Of course, via different selections of the DAC bit increment via the operator control interface 20 also other magnifications up to a magnification value of 1000× is possible.

The selection of the magnification is achieved using the image zoom unit 18 of the operator control interface.

Figure 9:
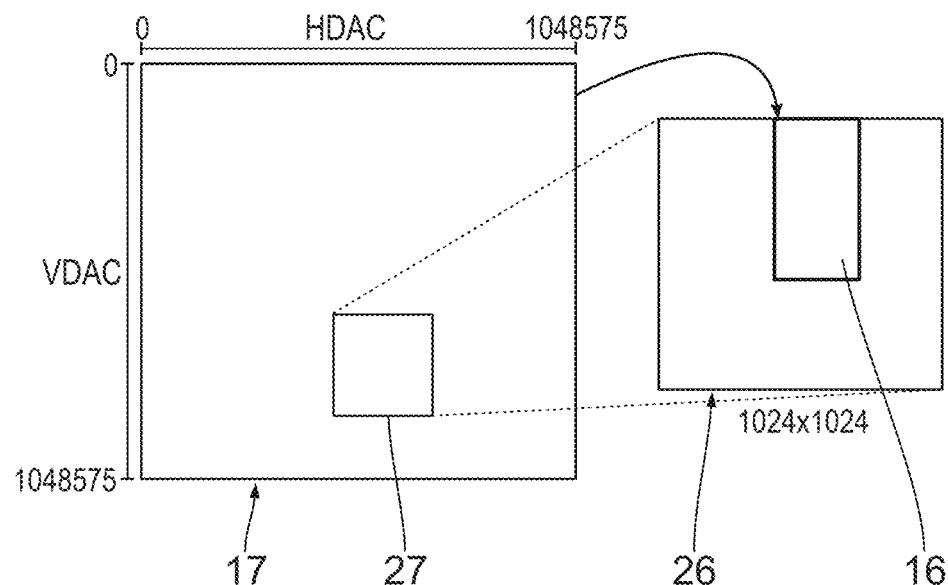
FIG. 9 in a depiction similar to that of FIG. 5 an assignment between the bit space and the pixel image according to the disclosure, wherein the adjacent pixel in the pixel image corresponds to an increment of 100 bits in the DAC code, wherein further the pixel image is shifted as compared to FIG. 8.

With respect to FIG. 9 the operation of the operator control interface 20 together with the image shifting unit 19 is exemplified. Here, a respective assignment between the respective image pixels of the image 26 and the digital inputs according to the DAC bit values in the bit space 17 is set via the image shifting unit. In the FIG. 9 embodiment, this is done by shifting the area 25 of FIG. 8 to a new shifted position resulting in a shifted bit area 27 within the bit space 17. Within such shifted bit area 27, the DAC bit increment also is 100 as in the FIG. 8 embodiment. So while the magnification of the image 25a is unchanged relative to 26, a different region of the sample has been imaged. Such image shift also does not require an interchange between different voltage amplifiers.

Figure 2:
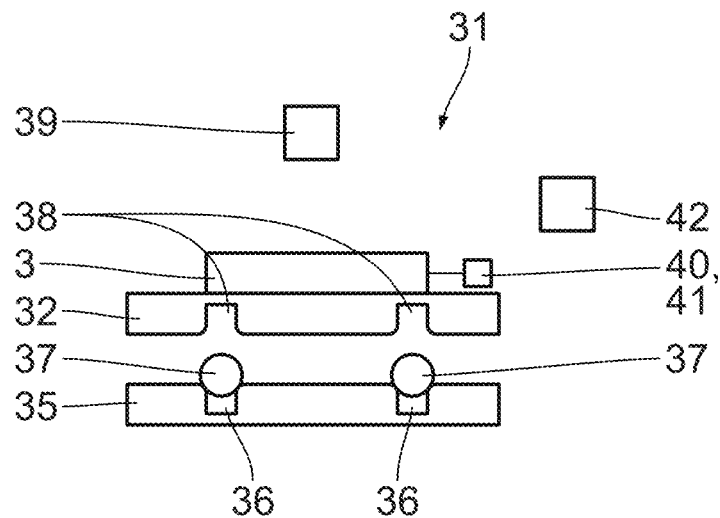
FIG. 2 also in a schematical sectional view components of an alignment subsystem to prealign a sample on a sample holder including an external kinematic mount to temporally receive the sample holder.

Further, the inspection system 1 includes an alignment subsystem 31 whose main components are shown in FIG. 2. Such alignment subsystem 31 serves to prealign the sample 3 on a sample holder 32 externally, whereas such sample holder 32 later is mounted on an internal kinematic mount 33 of a sample stage 34 of the inspection system 1.

The alignment subsystem 31 includes an external kinematic mount 35 to temporally receive the sample holder during the alignment of the sample 3 relative to the sampler holder 32. The external kinematic mount 35 is located external to the sample chamber 7. The external kinematic mount has recesses 36 in which hardened balls 37 are pressed during manufacturing of the external kinematic mount 35. In FIG. 2, two of such recess/ball pairs 36, 37 are shown. Also another number of such pairs, in particular three recess/ball pairs 36, 37, is possible. This serves as an example of a kinematic mounting system where the sample holder can be positioned repeatedly. Other designs might include cylinders, cones, or even magnets to assure repeatable positioning.

Figure 3:
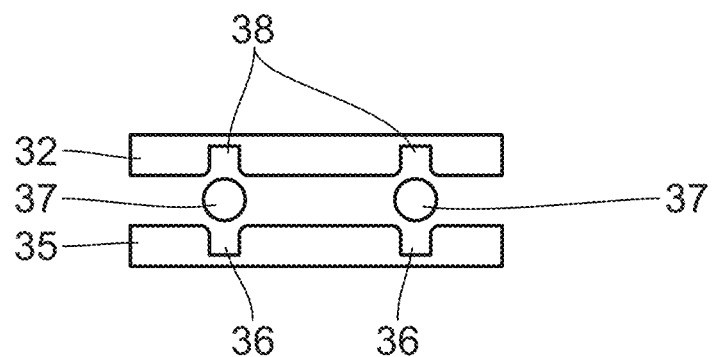
FIGS. 3 and 4 momentary situations of a process to produce a sample holder and an external kinematic mount according to FIG. 2.
Figure 4:
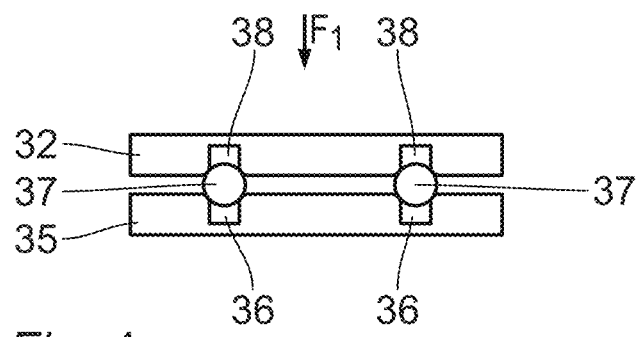

FIGS. 3 and 4 show momentary situations during the manufacturing of the external kinematic mount 35. The internal kinematic mount 33 may be manufactured in the same way.

FIG. 3 shows the external kinematic mount 35, the balls 37 and the sample holder 32 as raw prefabricated parts.

After positioning of the balls 37 in the raw recesses 36 of the external kinematic mount 35, counter recesses 38 which are provided in the sample holder 32 are aligned to the prepositioned balls 37. To each recess 36 of the external kinematic mount 35 a dedicated counter recess 38 of the sample holder 32 is aligned. After such alignment, the external kinematic mount 35 and the sample holder 32 are pressed together with an impressing force $F_i$ (FIG. 4). During such impressing step, the balls 37 are pressed into the respective recesses 36 in the external kinematic mount. Such impressing relative position of the ball 37 to the recesses 36 is such that the respective balls 37 perfectly fit to their respective counter recesses 38. After the impressing step of FIG. 4 the fabrication of the kinematic positionally assigned components of the sample holder 32 and the external kinematic mount 35 is completed. Such external kinematic mount provides a repeatable dismounting and remounting of the sample holder with position repeatability of the sample holder 32 with respect to the external kinematic mount 35 or the internal kinematic mount 33 which is better than 500 um, such position repeatability may be better than 100 um, may be better than 20 um and also might be better than 2 um and in particular might be better than 1 um.

In particular, the lateral positioning repeatability in the x and/or in the y direction is better than the μm values given above.

Further, the alignment subsystem 31 has an external imaging device 39 to acquire a relative position, in particular a relative lateral position, of the sample 3 on the sample holder 32 when mounted to the external kinematic mount 35. The external imaging device 39 may be an optical microscope, an infrared (IR) microscope or a fluorescence microscope.

Further, the alignment subsystem 31 has a x and y fine adjustment device 40 to adjust the relative lateral position of the sample 3 on the sample holder 32 when mounted to the external kinematic mount 35.

Further, the alignment subsystem 31 includes a locking unit 41 to lock the sample 3 on the sample holder 32 at a chosen relative lateral position after fine adjustment via the fine adjustment device 40.

In one embodiment, the x and y positioning device 40 is realized as x and y precision micrometers which cause the sample 3 to slide across the sample holder 32. In another embodiment, the positioning device 40 is realized as a motorized lead screw or a piezo-mechanical positioning system. Generally, the operator would cause the sample to be adjusted while absorbing its position with the viewing microscope, i.e. the external imaging device 39, until a recognizable feature of interest or fiducial is observed. The sample 3 is then locked or mechanically attached to the sample holder 32. This attachment can be achieved with a temporary adhesive as is customarily used in microscopy to affix samples to holders. Examples include silver paint, carbon paint, epoxy, glue, mechanical clamping mechanisms or magnetic clamping mechanisms. The external imaging device 39 may be aligned relative to the external mount 35 in the same way that the charged particle beam 4 is positioned relative to the internal mount 33.

With the same process steps as described above with respect to FIGS. 3 and 4, the internal kinematic mount 33 of the sample stage 34 is produced. During such production, the same sample holder 32 may be used which also was used during production of the external kinematic mount 35. The internal kinematic mount 33 also has recesses 36 and balls 37. The internal kinematic mount 33 serves to receive the sample holder 32 on the sample stage 34. The internal kinematic mount 33 has a lateral positioning repeatability regarding the lateral x/y positioning of the internal kinematic mount 33 relative to the sample holder 32 which is comparable to the positioning repeatability of the external kinematic mount 35. The internal kinematic mount 33 is located within the sample chamber 7.

Further, the inspection system 1 includes a transfer unit 42 schematically shown in FIG. 2 which serves to transfer the sample 3 locked to the sample holder 32 from the external kinematic mount 35 to the internal kinematic mount 33 via a respective air lock (not shown) of the sample chamber 7.

Depending on the specific embodiment, the sample stage 34 may be mounted to a moving stage 43 permitting a very limited relative movement between the sample holder 32 and the frame 6 of the inspection system 1.

The alignment subsystem 31 may be shared by several systems for which the system 1 is an example. The systems sharing the alignment subsystem 31 may constitute a set of systems to inspect, modify or analyze the ROI 2 of the sample 3 by different schemes through the use of charged particles. Further, all of the individual systems include an internal kinematic mount similar to the internal kinematic mount 33. All of these individual systems of the set share the alignment subsystem 31.

In a method to inspect the region of interest 2 of the sample 3 using the inspection system 1, the sample 3 rests on top of the sample holder 32. Then, the sample holder 32 is mounted to the external kinematic mount 35. After that, the relative position of the sample 3 on the sample holder 32 is acquired using the external imaging device 39. Then a fine adjusting of the relative position of the sample 3 on the sample holder 32 takes place using the fine adjustment device 40. Such adjustment is such that a given relative position results which enables an inspection of the ROI 2 in a subsequent inspection step. After such adjustment, the sample 3 on the sample holder 32 is locked using the locking unit 41 to fix the relative position of the sample 3 on the sample holder 32. Then the sample holder 32 with the finely adjusted and locked sample 3 is transferred from the external kinematic mount 35 to the internal kinematic mount 33 using the transfer unit 42. After that, the region of interest 2 of the sample 3 is inspected with the respective system.

The inspection system 1 further has a gas injection subsystem 45 including a gas duct 46 for delivery of a process gas to the ROI 2, a shut off valve 47 within such gas duct. The process gas is delivered via a heated crucible 48 which is in gaseous connection with the gas duct 46.

Further, the sample chamber 7 is in fluid connection to a vacuum pump 50 via a pump channel 49 being connected to the sample chamber 7.

What is claimed is:

1. A system to inspect, modify or analyze a region of interest of a sample via charged particles, the system comprising:
    a detector device configured to produce a pixel image comprising a horizontal pixel resolution and a vertical pixel resolution;
    a charged particle deflection device configured to produce a scanning charged particle beam in a scanning region in which the region of interest is disposable, the deflection device comprising:
        a horizontal deflection unit configured to produce a horizontal deflection of the charged particle beam; and
        a vertical deflection unit configured to produce a vertical deflection of the charged particle beam, wherein at least one member selected from the group consisting of the horizontal deflection unit and the vertical deflection unit is controllable via a digital to analog converter (DAC) having a digital resolution larger than at least one member selected from the group consisting of the horizontal pixel resolution and the vertical pixel resolution; and
    an operator control interface in signal connection with the detector device and the vertical and horizontal deflection units to select an assignment between: respective image pixels of a desired pixel image; and digital inputs of DAC to produce at least one member selected from the group consisting of horizontal deflection signals and vertical deflection signals to guide the charged particle beam to the location of the respective image pixel,
    wherein the operator control interface comprises an image shifting mechanism configured to alter an image position within the region of interest via a respective assignment between the respective image pixels of a chosen shift image and the digital inputs of the DAC.

2. The system of claim 1, wherein the pixel resolution of the pixel image and the DAC resolution are describable by a power of 2 and the DAC resolution is at least 2 times larger than the pixel resolution.

3. The system of claim 1, wherein the operator control interface comprises an image zoom capability configured to alter an image magnification of the region of interest via a respective assignment between the respective image pixels of a chosen zoom image and the digital inputs of the DAC.

4. The system of claim 1, wherein:
    the pixel resolution of the pixel image and the DAC resolution are describable by a power of 2 and the DAC resolution is at least 2 times larger than the pixel resolution; and
    the operator control interface comprises an image zoom capability configured to alter an image magnification of the region of interest via a respective assignment between the respective image pixels of a chosen zoom image and the digital inputs of the DAC.

5. The system of claim 4, wherein the operator control interface comprises an image shifting capability to alter an image position within the region of interest via a respective assignment between the respective image pixels of a chosen shift image and the digital inputs of the DAC.

6. The system of claim 1, wherein:
    the pixel resolution of the pixel image and the DAC resolution are describable by a power of 2 and the DAC resolution is at least 2 times larger than the pixel resolution; and
    the operator control interface comprises an image shifting capability to alter an image position within the region of interest via a respective assignment between the respective image pixels of a chosen shift image and the digital inputs of the DAC.

7. The system of claim 1, wherein the operator control interface comprises:
    an image shifting capability to alter an image position within the region of interest via a respective assignment between the respective image pixels of a chosen shift image and the digital inputs of the DAC; and
    an image shifting capability to alter an image position within the region of interest via a respective assignment between the respective image pixels of a chosen shift image and the digital inputs of the DAC.

8. The system of claim 1, wherein the charged particle column comprises a member selected from the group consisting of a focused ion beam subsystem and a scanning electron microscopy subsystem.

9. The system of claim 1, wherein the external imaging device comprises a member selected from the group consisting of an optical microscope, an infrared microscope, and a fluorescence microscope.

10. The system of claim 1, further comprising a sample holder and a frame, wherein the sample stage is configured to enable less than 500 μm of relative movement between the sample holder and the frame.

11. The system of claim 1, wherein:
    the operator control interface comprises an image shifting capability to alter an image position within the region of interest via a respective assignment between the respective image pixels of a chosen shift image and the digital inputs of the DAC; and
    the operator control interface comprises an image shifting capability to alter an image position within the region of interest via a respective assignment between the respective image pixels of a chosen shift image and the digital inputs of the DAC.

12. A set of systems configured to inspect, modify or analyze a region of interest of a sample via different schemes comprising inspection, modification or analysis by charged particles, wherein:
    one the systems is a system according to claim 1; and
    each system comprises:
        a charged particle column to inspect, modify or analyze a sample in a region in which the region of interest is disposable;

a sample chamber having a sample stage, wherein the systems of the set share;

a common alignment subsystem configured to prealign the sample on a sample holder to be later mounted on the sample stage in the sample chamber, the alignment subsystem comprising:

an external kinematic mount configured to temporally receive the sample holder, the external kinematic mount comprising a lateral positioning repeatability relative to the sample holder which is better than 200 μm, the external kinematic mount being located external to the sample chamber; and an external imaging device configured to acquire a relative lateral position of the sample on the sample holder when mounted to the external kinematic mount;

a fine adjustment device configured to finely adjust the relative lateral position of the sample on the sample holder when mounted to the external kinematic mount; and a locking unit configured to lock the sample on the sample holder at a chosen relative lateral position after fine adjustment; and an internal kinematic mount to receive the sample holder on the sample stage, the internal kinematic mount having a lateral positioning repeatability relative to the sample holder which is at least the positing repeatability of the external kinematic mount, and the internal kinematic mount being located within the sample chamber.

13. A method, comprising:
providing the system of claim 1;
attaching a sample to a sample holder;
mounting the sample holder to an external kinematic mount;
acquiring a relative position of the sample on the sample holder using an external imaging device;
fine adjusting the relative position of the sample on the sample holder using a fine adjustment device to enable inspection, modification or analysis of the region of interest in a subsequent inspection, modification or analyzing step;
locking the sample on the sample holder after fine adjustment;
transferring the sample holder with the finely adjusted sample from the external kinematic mount to an internal kinematic mount inside a sample chamber of the system;
inspecting modifying or analyzing the region of interest of the sample with the system;
unloading the sample on the sample holder from the internal kinematic mount from the system, and allowing a time to pass; and
reloading the sample into the same system and finding the region of interest within 500 um of the scanned region.

14. The system of claim 1, wherein the image shifting mechanism comprises an image shifting unit.

15. The system of claim 14, wherein the pixel resolution of the pixel image and the DAC resolution are describable by a power of 2 and the DAC resolution is at least 2 times larger than the pixel resolution.

16. The system of claim 14, wherein the operator control interface comprises an image zoom capability configured to alter an image magnification of the region of interest via a respective assignment between the respective image pixels of a chosen zoom image and the digital inputs of the DAC.

17. The system of claim 1, further comprising:
a sample chamber comprising a sample stage;
an alignment subsystem configured to prealign the sample on a sample holder to be later mounted on the sample stage in the sample chamber, the alignment subsystem comprising:

an external kinematic mount configured to temporally receive the sample holder, the external kinematic mount having a lateral positioning repeatability relative to the sample holder which is better than 200 μm, the external kinematic mount being located external to the sample chamber;

an external imaging device to acquire a relative lateral position of the sample on the sample holder when mounted to the external kinematic mount;

a fine adjustment device to finely adjust the relative lateral position of the sample on the sample holder when mounted to the external kinematic mount; and a locking unit to lock the sample on the sample holder at a chosen relative lateral position after fine adjustment; and an internal kinematic mount to receive the sample holder on the sample stage, the internal kinematic mount having a lateral positioning repeatability relative to the sample holder which is at least the positing repeatability of the external kinematic mount, the internal kinematic mount being located within the sample chamber; and a transfer unit to transfer the sample locked to the sample holder from the external kinematic mount to the internal kinematic mount.

18. The system of claim 17, wherein the charged particle column comprises a member selected from the group consisting of a focused ion beam subsystem and a scanning electron microscopy subsystem.

19. The system of claim 17, wherein the external imaging device comprises a member selected from the group consisting of an optical microscope, an infrared microscope, and a fluorescence microscope.

20. The system of claim 17, wherein the sample stage is configured to enable less than 500 um of relative movement between the sample holder and a frame of the system.

* * * * *

UNITED STATES PATENT AND TRADEMARK OFFICE
CERTIFICATE OF CORRECTION

Page 1 of 2

PATENT NO. : 12,270,774 B2
APPLICATION NO. : 18/653555
DATED : April 8, 2025
INVENTOR(S) : John A. Notte et al.

It is certified that error appears in the above-identified patent and that said Letters Patent is hereby corrected as shown below:

In the Specification

Column 7, Line 1, delete "crosshairs" and insert -- cross hairs --.

Column 8, Lines 33-65, delete "having a sample stage, wherein the systems of the set share a common alignment subsystem to prealign the sample on a sample holder to be later mounted on the sample stage in the sample chamber. The alignment subsystem includes: an external kinematic mount to temporally receive the sample holder, the external kinematic mount having a lateral positioning repeatability relative to the sample holder which is better than 200 um, the external kinematic mount being located external to the sample chamber; an external imaging device to acquire a relative lateral position of the sample on the sample holder when mounted to the external kinematic mount; a fine adjustment device to finely adjust the relative lateral position of the sample on the sample holder when mounted to the external kinematic mount; and a locking unit to lock the sample on the sample holder at a chosen relative lateral position after fine adjustment. All of the individual systems of the set include an internal kinematic mount to receive the sample holder on the sample stage. The internal kinematic mount has a lateral positioning repeatability relative to the sample holder which is at least the positing repeatability of the external kinematic mount. The internal kinematic mount is located within the sample chamber. A family of instruments, such as optical microscopes, SEMs, FIBs, can all rely upon the same kinematic mounts for reliable and repeatable sample transfer between them. This allows for the same region of interest to be imaged, analyzed, modified in all of these instruments (all with no or limited internal stages) provided the same kinematic mounting scheme is adopted through-out, and the initial sample positioning on the holder is performed. The systems of the set may share a transfer unit to transfer locked to the sample holder from the external kinematic mount to the internal kinematic mount." and insert the same on Column 8, Line 32, as a continuation of the same paragraph.

Column 11, Line 25, delete "220=" and insert -- $2^{20}=$ --.

Signed and Sealed this
Twenty-seventh Day of May, 2025

Coke Morgan Stewart
*Acting Director of the United States Patent and Trademark Office*

CERTIFICATE OF CORRECTION (continued)
U.S. Pat. No. 12,270,774 B2

In the Claims

Column 16, Line 63, Claim 12, delete "the" and insert -- of the --.